US009946492B2

(12) United States Patent
Diestelhorst et al.

(10) Patent No.: US 9,946,492 B2
(45) Date of Patent: Apr. 17, 2018

(54) CONTROLLING PERSISTENT WRITES TO NON-VOLATILE MEMORY BASED ON PERSIST BUFFER DATA AND A PERSIST BARRIER WITHIN A SEQUENCE OF PROGRAM INSTRUCTIONS

(71) Applicants: ARM Limited, Cambridge (GB); The Regents of the University of Michigan, Ann Arbor, MI (US)

(72) Inventors: Stephan Diestelhorst, Cambridge (GB); Aasheesh Kolli, Ann Arbor, MI (US); Ali Ghassan Saidi, Austin, TX (US); Peter Chen, Ann Arbor, MI (US); Thomas Friedrich Wenisch, Ann Arbor, MI (US)

(73) Assignees: ARM Limited, Cambridge (GB); The Regents of the University of Michigan, Ann Arbor, MI (US)

( * ) Notice: Subject to any disclaimer, the term of this patent is extended or adjusted under 35 U.S.C. 154(b) by 66 days.

(21) Appl. No.: 14/927,725

(22) Filed: Oct. 30, 2015

(65) Prior Publication Data
US 2017/0123723 A1  May 4, 2017

(51) Int. Cl.
*G06F 12/00* (2006.01)
*G06F 13/00* (2006.01)
(Continued)

(52) U.S. Cl.
CPC ............ *G06F 3/0656* (2013.01); *G06F 3/061* (2013.01); *G06F 3/0629* (2013.01);
(Continued)

(58) Field of Classification Search
CPC ...... G06F 3/0656; G06F 3/061; G06F 3/0629; G06F 3/0679; G06F 2212/60
See application file for complete search history.

(56) References Cited

U.S. PATENT DOCUMENTS 6,038,646 A * 3/2000 Sproull ............... G06F 9/30087
711/154
6,073,210 A * 6/2000 Palanca ............... G06F 13/1631
711/118
(Continued)

FOREIGN PATENT DOCUMENTS

EP          2 488 951        8/2012
EP          2 488 952        8/2012
(Continued)

OTHER PUBLICATIONS

S. Pelley et al., "Memory Persistency", University of Michigan, Jun. 14-18, 2014, 12 pages.
(Continued)

*Primary Examiner* — Mark A Giardino, Jr.
(74) *Attorney, Agent, or Firm* — Nixon & Vanderhye P.C.

(57) ABSTRACT

A data processing system 2 including non-volatile memory 22 manages the ordering of writes to the non-volatile memory and persist barrier instructions using a persist buffer storing persist buffer data. A write controller responds to the persist buffer data to prevent writing to the non-volatile memory for instructions following a given persist barrier instruction within a sequence of program instructions before the writes to the non-volatile memory which precede that given persist barrier instruction have at least been acknowledged as received by the memory system containing the non-volatile memory. In the case of a multi-core system, cache snooping mechanisms are used to pass persistency dependence data between cores such that strong persist atomicity may be tracked and managed between the cores.

26 Claims, 5 Drawing Sheets

(51) Int. Cl.
*G06F 3/06* (2006.01)
*G11C 16/10* (2006.01)
*G06F 13/28* (2006.01)
*G06F 12/02* (2006.01)

(52) U.S. Cl.
CPC ............ *G06F 3/0679* (2013.01); *G06F 13/00* (2013.01); *G11C 16/102* (2013.01); *G06F 12/0246* (2013.01)

(56) References Cited

U.S. PATENT DOCUMENTS

| | | | |
|---|---|---|---|
| 6,748,518 B1* | 6/2004 | Guthrie ............... | G06F 9/30087 711/144 |
| 7,917,676 B2* | 3/2011 | Sullivan, Jr. ............... | G06F 9/52 710/107 |
| 8,463,966 B2* | 6/2013 | Riocreux ............ | G06F 13/1621 710/107 |
| 8,589,638 B2 | 11/2013 | Campbell et al. | |
| 8,601,167 B2 | 12/2013 | Riocreux | |
| 8,713,292 B2 | 4/2014 | Nystad | |
| 9,032,252 B2 | 5/2015 | Kalkunte et al. | |
| 9,471,313 B1* | 10/2016 | Busaba ............... | G06F 9/30058 |
| 2009/0158085 A1* | 6/2009 | Kern ................... | G06F 11/1064 714/6.13 |
| 2014/0095806 A1* | 4/2014 | Fajardo ............... | G06F 12/0831 711/146 |
| 2015/0242238 A1* | 8/2015 | Cain ....................... | G06F 9/467 711/147 |

FOREIGN PATENT DOCUMENTS

WO WO 2011/045555 4/2011
WO WO 2011/045556 4/2011

OTHER PUBLICATIONS

V. Chidambaram et al., "Optimistic Crash Consistency", Dept. of Computer Sciences, University of Wisconsin, *SOSP' 13,* Nov. 3-6, 2013, 16 pages.
J. Condit et al., "Better I/O Through Byte-Addressable, Persistent Memory", Microsoft Research—UCLA, *SOSP '09,* Oct. 11-14, 2009, 14 pages.
A. Kolli et al., "Persistency Programming 101", University of Michigan, Mar. 2015, pp. 1-2.
K. Bhandari et al., "Implications of CPU Caching on Byte-addressable Non-Volatile Memory Programming", *HP Laboratories,* Dec. 6, 2012, 7 pages.
J. Coburn et al., "NV-Heaps: Making Persistent Objects Fast and Safe with Next-Generation, Non-Volatile Memories", Dept. of Computer Science and Engineering, University of California, *ASPLOS '11,* Mar. 5-11, 2011, 13 pages.
H. Volos et al., "Mnemosyne: Lightweight Persistent Memory", Dept. of Computer Sciences, University of Wisconsin—Madison, *ASPLOS '11,* Mar. 5-11, 2011, 13 pages.
J. Zhao et al., "Kiln: Closing the Performance Gap Between Systems With and Without Persistence Support", *MICRO-46,* Dec. 7-11, 2013, 12 pages.
Y. Lu et al., "Loose-Ordering Consistency for Persistent Memory", *IEEE,* Oct. 19-22, 2014, 8 pages.
B. Lee et al., "Architecting Phase Change Memory as a Scalable DRAM Alternative", *ISCA '09,* Jun. 20-24, 2009, pp. 1-12.
J. Zhao et al., "FIRM: Fair and High-Perfoll lance Memory Control for Persistent Memory Systems", Dec. 2014, 13 pages.

* cited by examiner

Persist Barrier - Persist Barrier

FIG. 6

Persist buffer entry

| Addr | Data | PersistID | Dependences | hasDeps? |

CONTROLLING PERSISTENT WRITES TO NON-VOLATILE MEMORY BASED ON PERSIST BUFFER DATA AND A PERSIST BARRIER WITHIN A SEQUENCE OF PROGRAM INSTRUCTIONS

BACKGROUND

Field

This disclosure relates to the field of data processing systems. More particularly, this disclosure relates to the control of memory accesses to non-volatile memory.

Description

It is known to provide data processing systems including both volatile and non-volatile memories. It is useful within such systems to provide mechanisms which control the order of writes to data to the non-volatile memories. One way of ensuring the ordering of writes to the non-volatile memory is to make the programmer responsible for explicitly flushing cache blocks through to the non-volatile memory to ensure correct ordering. As an example, in order to provide the correct order between two writes to different cache blocks, the programmer may be made responsible for flushing (using explicit instructions to evict and write back) the cache blocks in the desired order. While such techniques may ensure the correct ordering and operation system, they result in frequency stalling of the system in order for the flushing to occur and this adversely reduces system performance.

SUMMARY

At least some embodiments of the disclosure provide apparatus for processing data comprising:

processing circuitry to execute a sequence of program instructions including memory access instructions to generate non-volatile memory access requests to non-volatile memory;

a persist buffer to store persist buffer data indicative of a sequence of non-volatile writes to said non-volatile memory; and a write controller responsive to said persist buffer data to control writes to said non-volatile memory; wherein a persist barrier indicates for a set of writes that any writes of said set to said non-volatile memory preceding said persist barrier in said sequence of program instructions should be made before any of said set writes to said non-volatile memory following said persist barrier in said sequence of program instructions;

said persist buffer data is indicative of an order of any persist barrier relative to said sequence of non-volatile writes a relative order of any persist barrier within said sequence of non-volatile writes; and said write controller is responsive to said persist buffer data to prevent writing to said non-volatile memory by writes to said non-volatile memory following a given persist barrier within said sequence of program instructions before writes to said non-volatile memory preceding said given persist barrier within said sequence of program instructions.

At least some embodiments of the disclosure provide a method for processing data comprising:

executing a sequence of program instructions including memory access instructions to generate non-volatile memory access requests to non-volatile memory;

storing persist buffer data indicative of a sequence of non-volatile writes to said non-volatile memory; and in response to said persist buffer data, controlling writes to said non-volatile memory; wherein a persist barrier indicates for a set of writes that any writes of said set to said non-volatile memory preceding said persist barrier in said sequence of program instructions should be made before any writes of said set to said non-volatile memory following said persist barrier in said sequence of program instructions;

said persist buffer data is indicative of an order of any persist barrier relative to said sequence of non-volatile writes a relative order of any persist barrier within said sequence of non-volatile writes; and in response to said persist buffer data, preventing writing to said non-volatile memory by writes to said non-volatile memory following a given persist barrier within said sequence of program instructions before writes to said non-volatile memory preceding said given persist barrier within said sequence of program instructions.

Example embodiments will now be described, by way of example only, with reference to the accompanying drawings in which:

EMBODIMENTS

Figure 1:
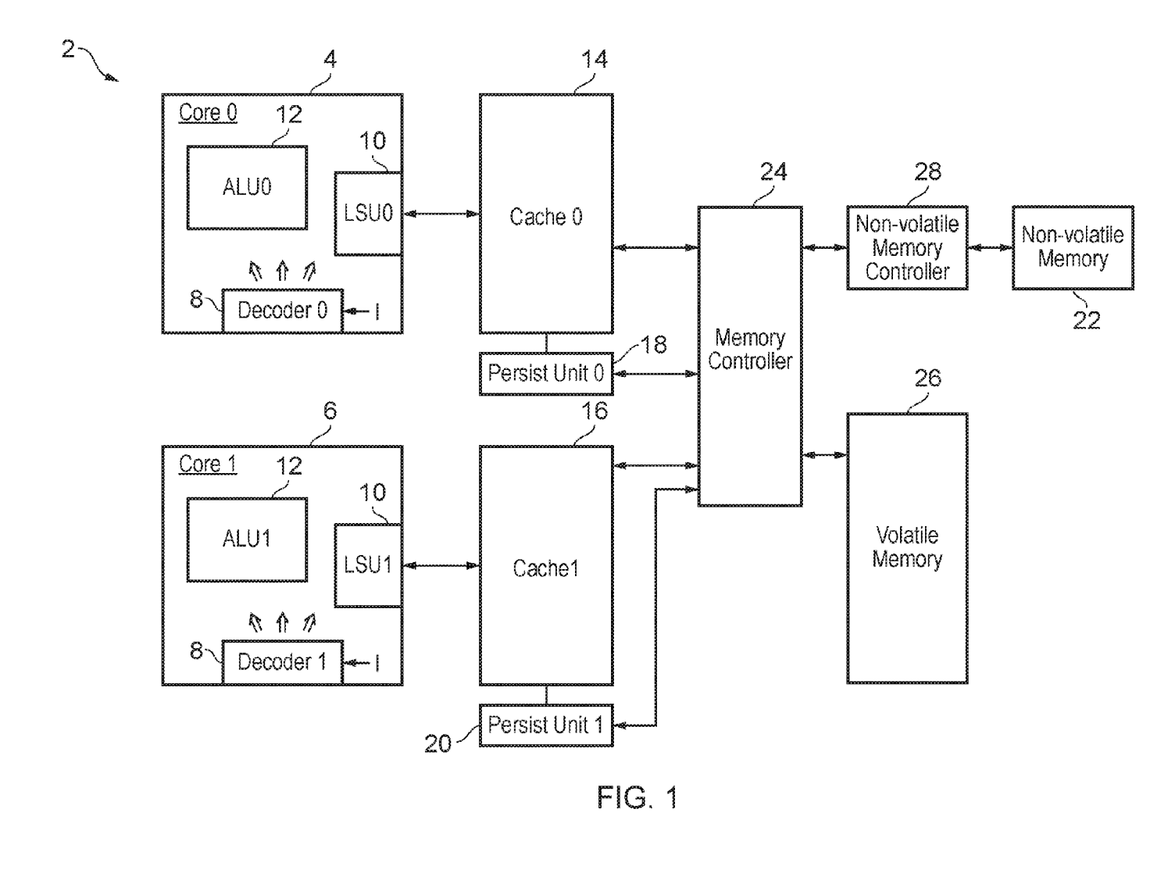
FIG. 1 schematically illustrates a data processing system including a plurality of processor cores, volatile memory and non-volatile memory.

FIG. 1 schematically illustrates a data processing system 2 including a plurality of processor cores 4, 6 each including an instruction decoder 8 for decoding program instructions, a load store unit 10 for performing memory accesses and an arithmetic logic unit 12 for performing arithmetic and logic processing operations. Program instructions from a sequence of program instructions are decoded by respective decoders 8 to generate control signals which control the processing to be performed in response to those decoded program instructions. In the case of memory access instructions and persist barrier instructions, these are executed/performed by the respective load store units 10. Each processor core 4, 6 has an associated cache memory 14, 16 for storing at least data to be manipulated by a respective processor core 4, 6. Also associated with each processor core 4, 6 is a respective persist unit 18, 20 which serves to control at least the ordering of write accesses to a non-volatile memory 22. The non-volatile memory 22 forms part of a memory system downstream of the cache memories 14, 16 that includes a memory controller 24, a volatile memory 26 and a non-volatile memory controller 28.

The persist barrier instructions provide persist barriers within the instruction sequence. The persist barrier instructions may be dedicated to that purpose or include that purpose in combination with some other action, e.g. a store and barrier instruction. The persist barriers may also be provided in other ways than using instructions, e.g. state data changes. The persist barriers may apply to all writes or to writes within one or more predetermined ranges of addresses.

The system of FIG. 1 utilises an epoch based approach. This approach, in this example, introduces barrier instructions to divide a thread's execution into epochs. The system seeks to ensure that writes from adjacent epochs are totally ordered. The system also seeks to ensure that conflicting accesses in both a volatile memory or a non-volatile memory may order writes in the non-volatile memory address space, while at the same time not having to resort to significant modifications of the cache replacement policy which can result in an undesirable reduction in performance.

The persist units 18, 20 provided for each processor core 4, 6 include a persist buffer and a write controller. The persist units 18, 20 store persist data including address and data value(s) that are to be written to the non-volatile memory 22. Cache coherence messages which are passed between the caches 14, 16 in order to manage data coherence may additionally be used, or augmented, in order to control the ordering of persist writes to the non-volatile memory arising from different processor cores 4, 6. The persist buffers within each persist unit 18, 20 store persist buffer data from which dependencies between different writes to the non-volatile memory 22 and persist barrier instructions may be determined and recorded in respect of pending writes to the non-volatile memory 22 and pending persist barrier instructions. The persist buffers may have the form of first-in-first-out memories (FIFOs). The persist buffer entries at the head of the FIFOs memories are drained by being issued to the memory system once all their dependencies are met. The memory system ensures that at least writes to the non-volatile memory 22 are not re-ordered once they have been issued.

The persist units 18, 20 which serve to buffer writes to the non-volatile memory 22 decouple such writes from cache eviction/writebacks thereby permitting normal high performance cache replacement algorithms/mechanisms to be used for the cache memories 14, 16.

Using epoch persistency, a thread's execution is broken down into epochs using persist barrier instructions. Epochs of a particular thread are serialised. However, the persistent writes (writes to non-volatile memories) within each epoch are concurrent and may be reordered relative to one another. The present techniques also support strong persist atomicity to enforce ordering between writes to non-volatile memory and persist barriers across threads in a multi-threaded environment.

Single Core Epoch Persistency

Persist barrier instructions divide a thread's execution into epochs. Persists (writes to non-volatile memory) within an epoch are concurrent, while the epochs are ordered. The persist units 18, 20 augment each processor core 4, 6 with a persist buffer in the form of a FIFO queue. Each persist buffer entry (forming part of the persist buffer data) contains the address and data associated with a persist (persist write). Persist barrier instructions also occupy an entry within the persist buffer. When a store instruction to an address within the non-volatile memory 22 retires at the processor core 4, 6, along with the updating of the respective local cache memory 14, 16, the processor 4, 6 also allocates and fills a corresponding persist buffer entry. If no free entry is found in the persist buffer, then the processor 4, 6 stalls until a persist buffer entry is available.

Persists are drained from the head of the persist buffer to the memory controller 24. The memory controller 24 is responsible for sending out an acknowledgement (a write acknowledgement) to a corresponding processor 4, 6 when a persist has been scheduled to be sent to the non-volatile memory 22. The memory controller is free to reorder un-acknowledged persist requests. The acknowledgement to the processor 4, 6 indicates that no subsequent persists issued to the processor will reach the non-volatile memory 22 before the acknowledged persist(s) has reached the non-volatile memory 22. The persist unit 18 uses these acknowledgements (write acknowledgements) to order epochs (using persist barrier instructions).

When a persist barrier reaches the head of the persist buffer, the persist unit 18, 20 stops draining until all previous persists have been acknowledged by the memory controller 24. In some embodiments the persist unit 18, 20 can track the drained and as yet un-acknowledged persists using a counter (incremented on a drain and decremented on receipt of a write acknowledge). Once such a counter reaches zero, this indicates that the persist(s) from previous epochs will reach the non-volatile memory 22 before any further persists that are subsequently issued. At this point, the persist unit 18, 20 can again start draining its persist buffer to the memory controller 24.

The memory controller 24 receives drains from each of the persist buffer FIFOs and places any received persists into an issue window. These persists may be reordered within the issue window by the memory controller 24. Once the number of requests within the issue window reaches a threshold, the memory controller stops placing new request into the issue window. All requests within the issue window are then acknowledged back to their originating processor core 4, 6 (and persist unit 18, 20) and the persists are scheduled for issue to the non-volatile memory 22 via the non-volatile memory controller 28. Any processor 4, 6 (persist unit 18, 20) which is waiting on a particular write acknowledgement from the memory controller 24 may then proceed again to drain their corresponding persist buffer.

The action of the mechanisms described above is such that the persist buffer serves to store persist buffer data which is indicative of a sequence of non-volatile writes to the non-volatile memory 22. A write controller within a respective persist unit 18, 20 serves to use the persist buffer data to control writes to the non-volatile memory. A persist barrier (instruction) within a sequence of program instructions indicates that any write to the non-volatile memory preceding that persist barrier (instruction) in the sequence of program instructions should be made before any writes to the non-volatile memory 22 following that persist barrier (instruction) in the sequence of program instructions. The persist buffer data stores entries for the persist barrier (instructions) which arise such that the persist buffer data is indicative of the relative order of any persist barrier (instructions) within a sequence of non-volatile writes represented by the persist buffer data. The write controller within the persist unit 18, 20 is responsive to the persist buffer data to prevent writing to the non-volatile memory 22 following a given persist barrier (instruction) before any writes to the non-volatile memory 22 which precede that persist barrier (instruction). It may be that persists (writes to the non-volatile memory 22) are issued from the persist unit 18, 20 before preceding persists have actually reached the non-volatile memory 22, but the memory system downstream of the persist unit 18, 20 ensures that such persists are not reordered.

Multi-Core Epoch Persistency

The data processing system 2 of FIG. 1 includes multiple processor cores 4, 6. In order to manage multi-core epoch persistency, each individual core should manage its epoch persistency for its own persists and persist barrier instructions as described above. Furthermore the system, supports strong persist atomicity to ensure that conflicting accesses (two accesses to the same address with at least one of them being a write) should occur in the same relative positions with respect to accesses to both the non-volatile memory and the volatile memory. Strong persist atomicity governs both accesses to the volatile memory and the non-volatile memory. Strong persist atomicity gives rise to four different kinds of persist dependencies as are illustrated in FIGS. 3, 4, 5 and 6. Each of these figures indicates the temporal order in which memory access instructions and persist barrier instructions are executed on different processor cores as well as the ordering to be ensured for the persist accesses and the persist barriers.

In order to ensure the persist dependencies illustrated in FIGS. 3, 4, 5 and 6 are obeyed, an existing cache coherence mechanism (e.g. cache snooping mechanism) is augmented to carry persist dependence information between the processor cores 4, 6. Furthermore, the persist buffer entries are augmented to carry information to convey the persist dependencies which are identified. While adding a persist to a persist buffer of a particular core, a snoop is sent to the other cores in order to identify any persists or persist barriers associated with those other cores upon which the new persist to be added depends.

The persist buffers are drained from their head as in the case for the single core operation. Cores stall from draining any persist or persist barrier until all its dependencies have been met (e.g. drained and subject to write acknowledgements from the memory controller 24). The cache coherency mechanisms which are typically already provided permit the write acknowledgements from the memory controller to be observed by all of the cores as this is already used for cache coherency control. Such snoop requests and snoop responses are typically passed across a memory bus (snoop bus).

Figure 2:
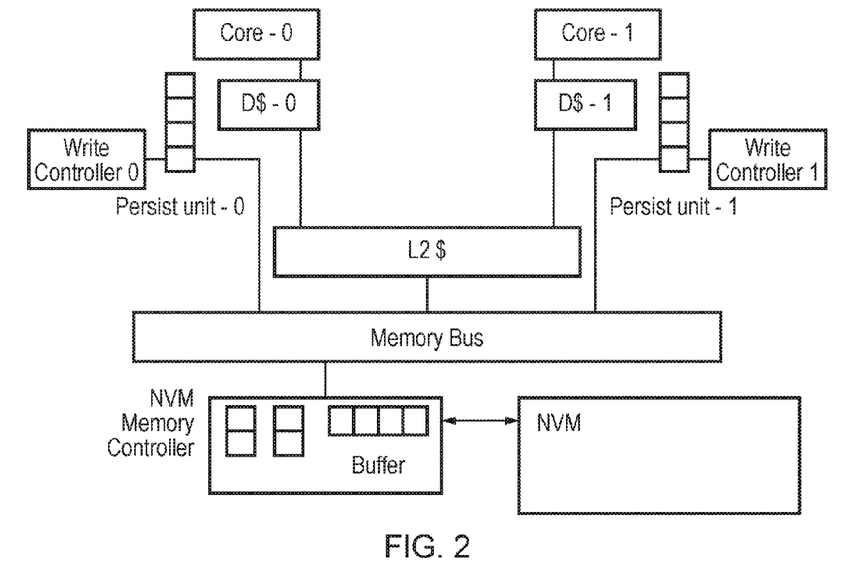
FIG. 2 schematically illustrates a data processing system including a plurality of processor cores each having an associated persist unit including a persist buffer and a write controller for the purposes of controlling at least write accesses to a non-volatile memory.

FIG. 2 schematically illustrates data processing system including mechanism supporting epoch persistency and strong persist atomicity across the multiple cores. Each persist unit includes at least the persist buffers as described above and associated Bloom filters and as will be described further below.

Figure 7:
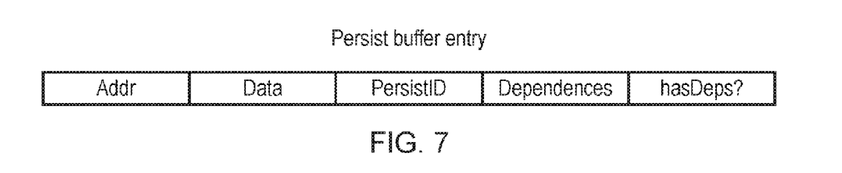
FIG. 7 schematically illustrates a persist buffer entry.

FIG. 7 schematically illustrates a persist buffer entry. These persist buffer entries are stored within a corresponding persist buffer in respect of all the outstanding persist requests (both writes to the non-volatile memory 22 and persist barrier instructions) which have yet to be retired. As illustrated, each persist buffer entry includes the following five components:

Address—contains the address of the persist. This is required for writing back to non-volatile memory and snooping purposes. A special address is used for persist barriers Data—contains the data which has to be subject to the persistent write. Placing this data in the persist buffer decouples the write back to the non-volatile memory 22 from the cache replacement policy.

persist ID—stores an identifier generated as an incrementing (could alternatively be decrementing) counter for each persist buffer entry. These identifiers are unique to each core and are used to identify persist dependencies and acknowledgements from the memory controller.

Dependencies—each persist entry may depend upon one persist buffer entry at each other core. The persist buffer entry stores one persist ID per other core in the system. In the common case, a persist has fewer than one dependence.

hasDependence—this is a bit which represents if a particular persist buffer entry has any dependence. It is initially set to false. It is changed to true when a snoop hits upon the persist buffer entry concerned. The bit is useful in different ways, e.g. (1) to identify the youngest dependence if a persist snoop hits on two active persist buffer entries; (2) to identify if a subsequent persist can coalesce with an earlier persist to the same address; and (3) to satisfy the cache coherency requests for data of the cache block as sometimes the persist buffers may have to respond to the cache coherency requests for the data, e.g. when all the caches 14, 16 have evicted a certain block before the persist is written back to the non-volatile memory 22, then the latest valid data for that address is the data present in the persist buffer entry which has the bit not set.

Figure 3:
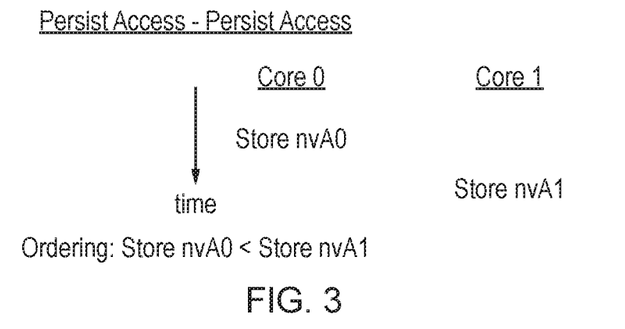
FIGS. 3 to 6 schematically illustrates respective different kinds of persist dependencies to be satisfied.
Figure 4:
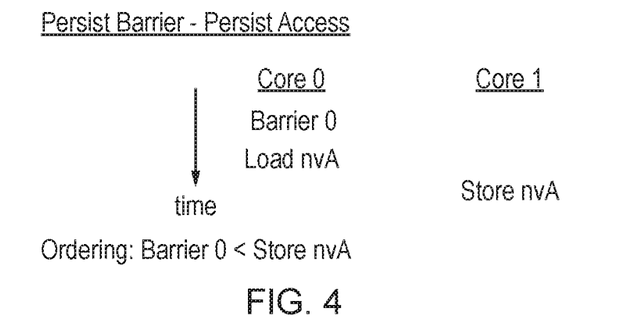
Figure 5:
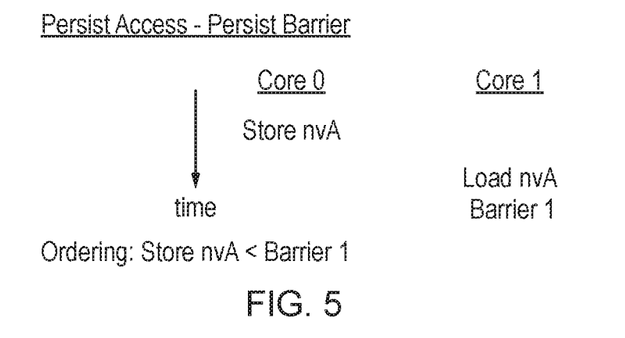
Figure 6:
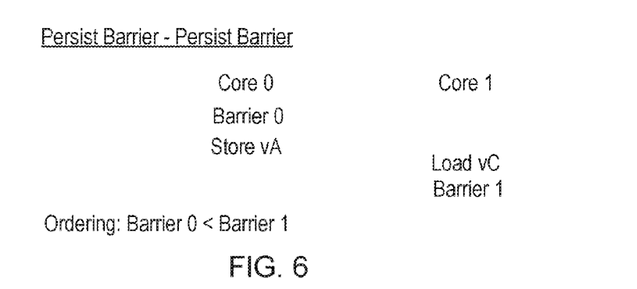
Figure 8:
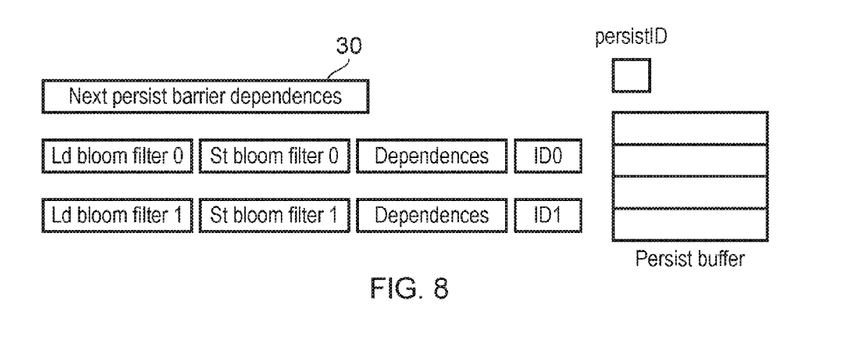
FIG. 8 schematically illustrates a persist buffer including memory access log circuitry and barrier dependency log circuitry.

As indicated in the dependency scenarios illustrated in FIGS. 3, 4 and 5, the persistency for a persist barrier instruction is determined by the loads and stores executed before and after that persist barrier instruction. For example, in the case of the scenario of FIG. 4, the barrier should "remember" all the loads and stores performed after it until the next barrier arises, so that any conflicting store which snoops the persist buffer will recognise a dependence upon that barrier. Storing all the load and store addresses uniquely will impose a large and unbounded hardware overhead. Instead, the system uses Bloom filters associated with each active barrier as illustrated in FIG. 8. One of the Bloom filters is updated in respect of loads after a barrier and the other in respect of stores after a barrier. Any incoming snoop requests query the Bloom filters with its address. If the result of a query is a hit, then the persist which generated the snoop request is dependent upon the subsequent persist barrier in order to ensure that all of those loads and stores recorded in the respective Bloom filter will have been performed for the persist which is associated with the snoop request performed.

As is known by those in this technical field, Bloom filters may be used to represent data in a compact fashion, but are inexact. The Bloom filters may produce false positive hits, but will not produce false negatives. The load and store Bloom filters will err by indicating a dependence which is not actually a case. While this may degrade performance it does not compromise recovery correctness. The Bloom filters form memory access log circuitry. The persist unit as illustrated in FIG. 8 is provided with Bloom filters in respect of two persist barriers which may be pending at any given time within the persist buffer. If a further persist barrier needs to be tracked, then Bloom filters will not be available and the associated processor core 4, 6 will stall as it will not be able to add the persist barrier to the persist buffer. Each time a load or store is performed after a barrier, the system updates the corresponding Bloom filter. The Bloom filters are snooped by incoming snoop requests and, in the case of a hit, the access which generated the snoop is further processed as dependent upon the persist barrier. The snoop response accordingly contains the persistID of the persist barrier for the snoop generating core to monitor.

It will be readily apparent to those skilled in the art that alternative embodiments of this invention may replace the Bloom filter with means to track loads and stores exactly, or alternate means to encode load and store addresses approximately.

The persist units should also track dependencies for persist barriers as illustrated in the scenarios of FIGS. 3 and 5. The persist unit as illustrated in FIG. 8 includes barrier dependency log circuitry 30 to record data indicative of any persist barrier dependencies. The dependencies for a persist barrier arise from the loads and stores executed prior to the barrier (in the previous epoch). During a given epoch the persist dependencies are recorded in the barrier dependency log circuitry 30. It is sufficient to store only the youngest dependence for each of the other cores. The data indicative of any persistence barrier dependency stored within the barrier dependency log circuitry is updated for every load and store instruction executed upon a different core during the current epoch for the core. When the epoch ends (e.g. when a new persist barrier instruction is executed), the dependency data stored within the barrier dependency log circuitry is transferred to the persist barriers buffer entry within the persist buffer for the newly executed persist barrier instruction. The persist barriers buffer entry (in the same way as for other entries) is not drained until all of its dependencies have been drained and acknowledged from their respective persist units 18, 20.

Actions to be Performed Under when Executing Memory Instructions:
1. Load miss:
   a) Snoop all persist buffers and store Bloom filters for active persist barriers at other cores, will receive dependency ID if snoop hit (one per core).
   b) Add dependency ID to the dependencies of the next persist barrier. If a dependency already present use Max(old ID, new ID) (per core).
   c) Add load address to load bloom filter of the most recent persist barrier in the persist buffer.
2. Load Hit:
   Add load address to load bloom filter of the most recent persist barrier in the persist buffer.
3. Store Miss:
   a. If store is to a non-volatile address, allocate an entry in the persist buffer, if no entry available, stall until entry becomes free.
   b. Snoop all persist buffers and load&store bloom filters for active persist barriers at other cores, will receive dependency ID if snoop hit (one per core)
   c. If store is to a non-volatile address, add dependence to persist buffer entry. Else, add dependence to the next persist barrier dependence structure. If a dependency already present use Max(old ID, new ID) (per core).
   d. If store is to a volatile address, add address to youngest active persist barrier's store bloom filter.
4. Store Hit:
   a. If store is to non-volatile address, try coalescing (explained later), if not possible, allocate a new entry in persist buffer, stall if not available.
   b. If store is to a volatile address, add store address to store bloom filter of the youngest persist barrier's store bloom filter.
5. Persist barrier:
   a. Allocate persist buffer entry, stall if not available
   b. Allocate load and store bloom filters, stall if not available
   c. Copy dependences from the next persist barrier dependence structure to the persist buffer entry.

Actions to be Performed when Receiving a Snoop Request:
1. readSnoop (load miss):
   a) Snoop the active store bloom filters and the active persist buffer entries.
   b) Multiple hits possible, find the max persistID
   c) Include dependence (max persistID) in response
   d) If the "hasDependence" bit is not set, include data in the response.
   readExSnoop (Store Miss):
   e. Snoop the active store bloom filters and the active persist buffer entries.
   f. Multiple hits possible, find the max persistID
   g. Include dependence (max persistID) in response
   h. If the "hasDependence" bit is not set, include data in the response.
   i. Set the "hasDependence" bit in the corresponding persist buffer entry Coalescing:
If a new non-volatile store can piggyback on the persist buffer entry of an older non-volatile store to the same address, then coalescing is said to have happened. The two conditions required for coalescing are as follows:
1. No barrier instruction between the older persist buffer entry and head of the buffer (Can be relaxed).
2. The hasDependence bit at the older persist buffer entry is not set.

Figure 9:
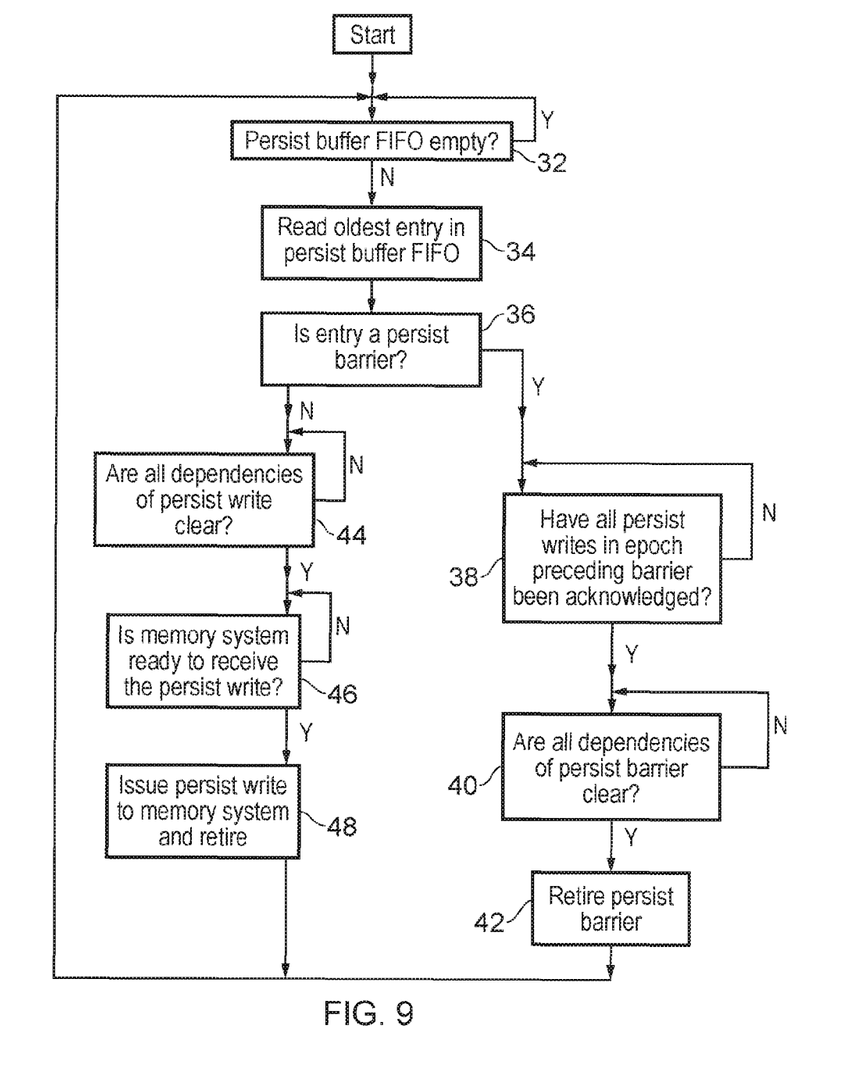
FIG. 9 is a flow diagram schematically illustrating the operation of a persist buffer and a write controller for controlling memory accesses to a non-volatile memory.

FIG. 9 is a flow diagram schematically illustrating the operation of a persist unit 18, 20 in controlling retirement of persist buffer entries. At step 32 processing waits until the persist buffer is not empty. At step 34 the oldest entry within the persist buffer is read. Step 36 determines whether the entry ready at step 34 is a persist barrier. If the entry read is a persist barrier, then step 38 waits until all persist writes in the epoch corresponding to the persist barrier read at step 36 have been acknowledged by the memory controller 24. When all such persist writes have been acknowledged, then step 40 determines whether there are any dependencies in respect of the persist barrier 36, and, if so, whether these are all clear (met). These dependencies indicate dependencies upon loads and stores or persist barriers within different cores. When all these dependencies are clear, then processing proceeds to step 42 at which the persist barrier is retired from the persist buffer and processing returns to step 32.

If the determination at step 32 is that the entry read is not a persist barrier, then processing proceeds to step 44 where a determination is made as to whether or not all the dependencies of the persist write are clear (met). As mentioned above, these dependencies are those arising due to loads and stores or persists barriers on other cores. When all these dependencies are clear, then processing proceeds to step 46 where a determination is made as to whether or not the memory system is ready to receive the persist write. When the memory system is ready to receive the persist write, then step 48 serves to issue the persist write to the memory system and to retire the persist write from the write buffer. Processing then returns to step 32.

Although illustrative embodiments have been described in detail herein with reference to the accompanying drawings, it is to be understood that the claims are not limited to those precise embodiments, and that various changes, additions and modifications can be effected therein by one skilled in the art without departing from the scope and spirit of the appended claims. For example, various combinations of the features of the dependent claims could be made with the features of the independent claims.

We claim:

1. Apparatus for processing data comprising:
processing circuitry to execute a sequence of program instructions including memory access instructions to generate non-volatile memory access requests to non-volatile memory;
a persist buffer to store persist buffer data indicative of a sequence of persistent writes to said non-volatile memory; and
a write controller responsive to said persist buffer data to control persistent writes to said non-volatile memory; wherein
a persist barrier indicates for a set of persistent writes that any persistent writes of said set to said non-volatile memory preceding said persist barrier in said sequence of program instructions should be made before any of said set of persistent writes to said non-volatile memory following said persist barrier in said sequence of program instructions;
said persist buffer data is indicative of a relative order of any persist barrier within said sequence of persistent writes to said non-volatile memory;
said write controller is responsive to said persist buffer data to prevent writing to said non-volatile memory by persistent writes to said non-volatile memory following a given persist barrier within said sequence of program instructions before persistent writes to said non-volatile memory preceding said given persist barrier within said sequence of program instructions;
further processing circuitry to execute a further sequence of program instructions including memory access instructions to generate non-volatile memory access requests to said non-volatile memory;
a further persist buffer to store further persist buffer data indicative of a further sequence of persistent writes to said non-volatile memory and persist barrier instructions; and
a further write controller responsive to said further persist buffer data to control writes to said non-volatile memory;
wherein, when said persist buffer data is changed to represent one of a youngest write to said non-volatile memory by said processing circuitry and a youngest persist barrier instruction of said processing circuitry, said persist buffer is configured to send a snoop request to said further persist buffer to identify any writes to said non-volatile memory and any persist barrier instructions represented by said further persist buffer data upon which one of said youngest write and said youngest persist barrier instruction is dependent.

2. Apparatus as claimed in claim 1, wherein said persist barrier corresponds to a persist barrier instruction within said sequence of program instructions.

3. Apparatus as claimed in claim 1, wherein said persist buffer is a first-in-first-out memory.

4. Apparatus as claimed in claim 1, wherein said persist buffer data is an ordered sequence of persist buffer data entries.

5. Apparatus as claimed in claim 4, wherein said ordered sequence of persist buffer data entries includes respective entries for each persistent write to said non-volatile memory, or respective entries for each persist barrier instruction.

6. Apparatus as claimed in claim 1, comprising
a cache memory to cache data stored in said non-volatile memory; and wherein
a write of given data from said cache memory to said non-volatile data is buffered within said persist buffer and said given data is removed from said cache memory before said given data is written to said non-volatile memory.

7. Apparatus as claimed in claim 1, wherein said persist buffer data comprises address data and data values for said sequence of persistent writes to said non-volatile memory.

8. Apparatus as claimed in claim 1, wherein said write controller is responsive to detecting said given persist barrier instruction is an oldest instruction represented by said persist barrier data to block persistent writes to said non-volatile memory following said given persist barrier instruction until receipt of write acknowledgements for all of said persistent writes to said non-volatile memory preceding said given persist barrier instruction.

9. Apparatus as claimed in claim 8, wherein said write controller comprises a counter to track unacknowledged persistent writes to said non-volatile memory.

10. Apparatus as claimed in claim 1, wherein said persist buffer and said further persist buffer are configured to communicate persist dependence data to track dependencies between memory accesses to said non-volatile memory by said processing circuitry and memory accesses to said non-volatile memory by said further processing circuitry.

11. Apparatus as claimed in claim 1, wherein said further persist buffer is responsive to said snoop request to return a snoop response to said persist buffer identifying any writes to said non-volatile memory and any persist barrier instructions represented by said further persist buffer data upon which one of said youngest write and said youngest persist barrier instruction is dependent.

12. Apparatus as claimed in claim 11, wherein said persist buffer is configured to add dependency data to said persist buffer data to represent any dependencies identified in said snoop response.

13. Apparatus as claimed in claim 12, wherein said write controller is configured to block a write to said non-volatile memory in conflict with said dependency data.

14. Apparatus as claimed in claim 12, wherein said persist buffer is configured to monitor persistent writes made corresponding to said further persist buffer data to clear said dependency data.

15. Apparatus as claimed in claim 11, wherein said further persist buffer data includes has dependencies data identifying any persistent writes to said non-volatile memory and persist barriers represented by said further persist buffer data upon which any persistent writes to said non-volatile memory and persist barriers represented by said persist buffer data depend.

16. Apparatus as claimed in claim 1, wherein said persist buffer comprises memory access log circuitry to store data to identify memory accesses corresponding to memory access instructions executed by said processing circuitry following a youngest persist barrier instruction represented by said persist buffer data.

17. Apparatus as claimed in claim 16, wherein said memory access log circuitry comprises Bloom filter circuitry.

18. Apparatus as claimed in claim 17, wherein said Bloom filter circuitry comprises a load Bloom filter to store data to identify load memory access instructions executed by said processing circuitry and a store Bloom filter to store data to identify store memory access instructions executed by said processing circuitry.

19. Apparatus as claimed in claim 16, wherein said further persist buffer is responsive to a given memory access corresponding to a memory access instruction executed by said further processing circuitry to send a snoop request to said memory access log circuitry to identify any persist barrier dependency between said given memory access and any older memory access by said processing circuitry.

20. Apparatus as claimed in claim 19, wherein said further persist buffer comprises further barrier dependency log circuitry to record data indicative of any persist barrier dependency.

21. Apparatus as claimed in claim 20, wherein said further barrier dependency log circuitry logs data is indicative of a youngest memory access by said processing circuitry corresponding to any persist barrier dependency.

22. Apparatus as claimed in claim in claim 1, comprising a plurality of further processing circuitry, a plurality of further persist buffers and one or more write controllers.

23. Apparatus as claimed in claim 1, wherein said set of persistent writes is one of: all persistent writes and persistent writes to addresses within one or more predetermined ranges of addresses.

24. A method for processing data comprising:
executing, with processing circuitry, a sequence of program instructions including memory access instructions to generate non-volatile memory access requests to non-volatile memory;
storing, with a persist buffer, persist buffer data indicative of a sequence of persistent writes to said non-volatile memory; and
in response to said persist buffer data, controlling, with a write controller, persistent writes to said non-volatile memory; wherein
a persist barrier indicates for a set of persistent writes that any persistent writes of said set to said non-volatile memory preceding said persist barrier in said sequence of program instructions should be made before any persistent writes of said set to said non-volatile memory following said persist barrier in said sequence of program instructions;
said persist buffer data is indicative of a relative order of any persist barrier within said sequence of persistent writes to said non-volatile memory;
in response to said persist buffer data, said write controller preventing writing to said non-volatile memory by persistent writes to said non-volatile memory following a given persist barrier within said sequence of program instructions before persistent writes to said non-volatile memory preceding said given persist barrier within said sequence of program instructions;
executing, with further processing circuitry, a further sequence of program instructions including memory access instructions to generate non-volatile memory access requests to said non-volatile memory;
storing, with a further persist buffer, further persist buffer data indicative of a further sequence of persistent writes to said non-volatile memory and persist barrier instructions; and
controlling, with a further write controller responsive to said further persist buffer data, writes to said non-volatile memory;
wherein, when said persist buffer data is changed to represent one of a youngest write to said non-volatile memory by said processing circuitry and a youngest persist barrier instruction of said processing circuitry, said persist buffer sending a snoop request to said further persist buffer to identify any writes to said non-volatile memory and any persist barrier instructions represented by said further persist buffer data upon which one of said youngest write and said youngest persist barrier instruction is dependent.

25. Apparatus for processing data comprising:
processing circuitry to execute a sequence of program instructions including memory access instructions to generate non-volatile memory access requests to non-volatile memory;
a persist buffer to store persist buffer data indicative of a sequence of persistent writes to said non-volatile memory; and
a write controller responsive to said persist buffer data to control persistent writes to said non-volatile memory; wherein
a persist barrier indicates for a set of persistent writes that any persistent writes of said set to said non-volatile memory preceding said persist barrier in said sequence of program instructions should be made before any of said set of persistent writes to said non-volatile memory following said persist barrier in said sequence of program instructions;
said persist buffer data is indicative of a relative order of any persist barrier within said sequence of persistent writes to said non-volatile memory;
said write controller is responsive to said persist buffer data to prevent writing to said non-volatile memory by persistent writes to said non-volatile memory following a given persist barrier within said sequence of program instructions before persistent writes to said non-volatile memory preceding said given persist barrier within said sequence of program instructions;
further processing circuitry to execute a further sequence of program instructions including memory access instructions to generate non-volatile memory access requests to said non-volatile memory;
a further persist buffer to store further persist buffer data indicative of a further sequence of persistent writes to said non-volatile memory and persist barrier instructions; and
a further write controller responsive to said further persist buffer data to control writes to said non-volatile memory;
wherein said persist buffer comprises memory access log circuitry to store data to identify memory accesses corresponding to memory access instructions executed by said processing circuitry following a youngest persist barrier instruction represented by said persist buffer data;
wherein said further persist buffer is responsive to a given memory access corresponding to a memory access instruction executed by said further processing circuitry to send a snoop request to said memory access log circuitry to identify any persist barrier dependency between said given memory access and any older memory access by said processing circuitry;
wherein said further persist buffer comprises further barrier dependency log circuitry to record data indicative of any persist barrier dependency;
wherein said further barrier dependency log circuitry logs data is indicative of a youngest memory access by said processing circuitry corresponding to any persist barrier dependency;
wherein, when said further persist buffer data is changed to represent a youngest persist barrier instruction executed by said further processing circuitry, said further buffer data for said youngest persist barrier instruction is formed to represent any persist barrier dependency between said youngest persist barrier instruction and said youngest memory access by said processing circuitry corresponding to a persist barrier dependency.

26. Apparatus as claimed in claim 25, wherein said further persist buffer is responsive to memory accesses corresponding to memory access instructions executed by said processing circuitry to ensure any persist barrier dependency for an oldest persist barrier instruction executed by said further processing circuitry is met before any memory accesses to said non-volatile memory corresponding to memory access instructions executed by said further processing circuitry and younger than said oldest persist barrier instruction are made.

\* \* \* \* \*